United States Patent [19]

Kakumu et al.

[11] Patent Number: 4,721,687
[45] Date of Patent: Jan. 26, 1988

[54] METHOD OF INCREASING THE THICKNESS OF A FIELD OXIDE

[75] Inventors: Masakazu Kakumu, Yokohama; Sigeru Morita, Toyko, both of Japan

[73] Assignee: Kabushiki Kaisha Toshiba, Kawasaki, Japan

[21] Appl. No.: 11,892

[22] Filed: Feb. 6, 1987

[30] Foreign Application Priority Data

May 31, 1986 [JP] Japan .................................. 61-126348

[51] Int. Cl.⁴ ...................... H01L 21/94; H01L 21/95
[52] U.S. Cl. ........................................ 437/69; 437/233; 437/238; 437/241; 156/657; 156/653; 148/DIG. 117
[58] Field of Search ..................... 29/576 W, 580, 578; 156/653, 657, 643; 357/49; 148/1.5, DIG. 117; 427/93, 94

[56] References Cited

U.S. PATENT DOCUMENTS

| | | | |
|---|---|---|---|
| 4,407,696 | 10/1983 | Han et al. | 29/576 W |
| 4,539,744 | 9/1985 | Burton | 29/576 W |
| 4,594,769 | 6/1986 | Ellwanger | 156/657 |
| 4,612,701 | 9/1986 | Cox | 29/576 W |

OTHER PUBLICATIONS

Ghandhi, S., "VLSI Fabrication Principles", 1983, pp. 576–577.

Primary Examiner—Brian E. Hearn
Assistant Examiner—Kevin McAndrews
Attorney, Agent, or Firm—Finnegan, Henderson, Farabow, Garrett & Dunner

[57] ABSTRACT

A method of manufacturing a semiconductor substrate, and, in particular, a technique of electrically isolating a semiconductor element formed on a semiconductor substrate. The method comprises the steps of depositing a silicon oxide layer on the surface of a silicon substrate, for its protection; forming a silicon nitride layer on the silicon oxide layer; selectively eliminating the silicon nitride layer; oxidizing the silicon substrate, with the retained silicon nitride layer being used as a mask, thereby providing an oxide layer; depositing a polycrystalline silicon layer on the oxide layer and the retained acid-resisting layer; oxidizing the polycrystalline silicon layer to provide an insulation layer; eliminating the insulation layer until the silicon nitride layer is exposed; and removing all the silicon nitride layer. The method is capable of enabling the formation of a thick semiconductor element-isolating oxide layer, with a high precision, in a narrow region from which the semiconductor element is to be isolated.

19 Claims, 11 Drawing Figures

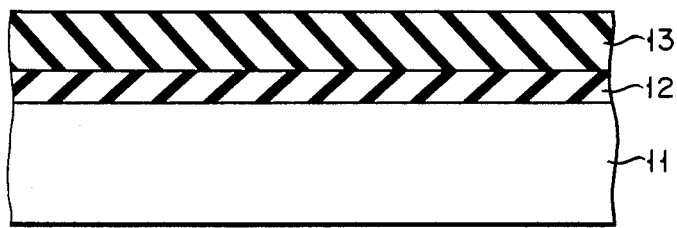
F I G. 2A
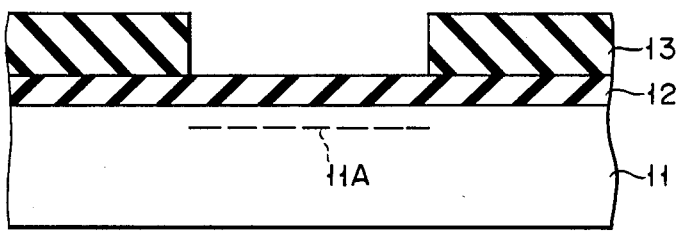
F I G. 2B
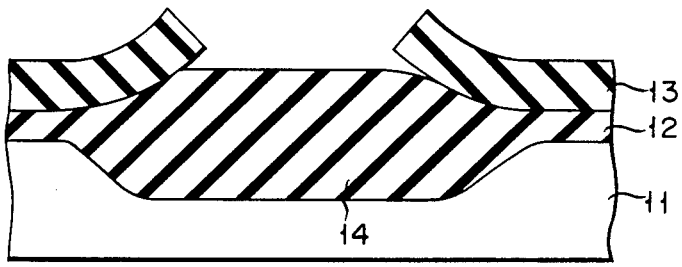
F I G. 2C

F I G. 2D
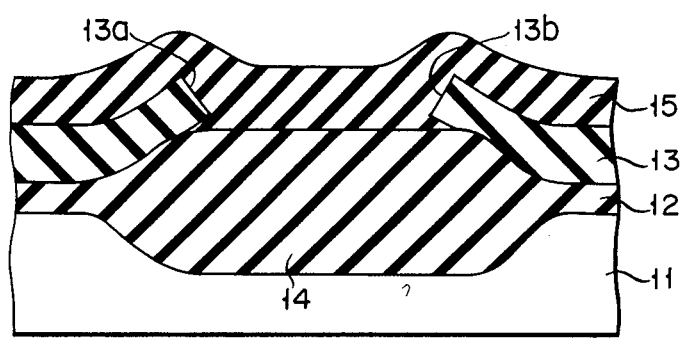
F I G. 2E
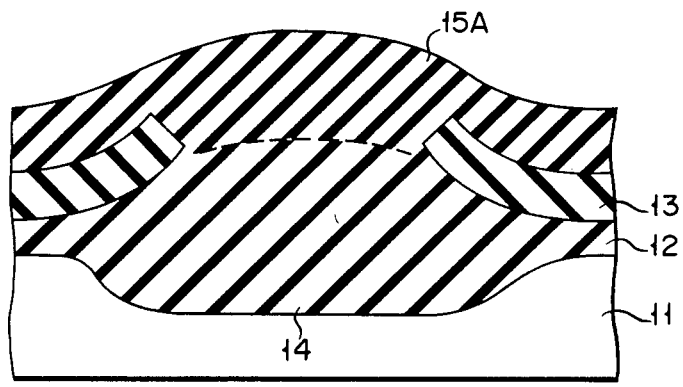
F I G. 2F
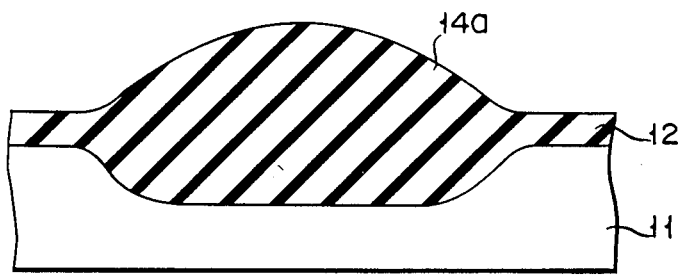

F I G. 3A
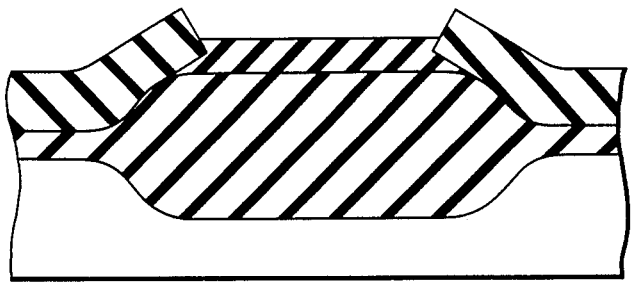
F I G. 3B
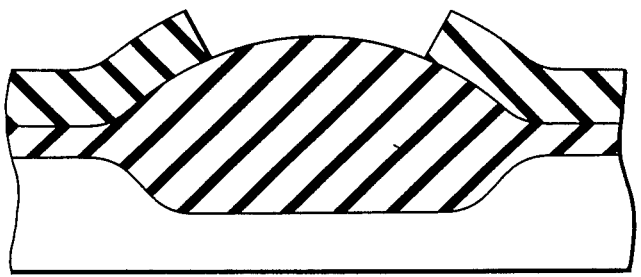
F I G. 3C
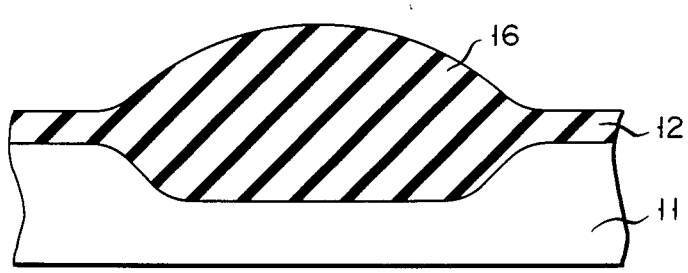

METHOD OF INCREASING THE THICKNESS OF A FIELD OXIDE

BACKGROUND OF THE INVENTION

This invention relates to a method of manufacturing a semiconductor apparatus, and more particularly, to a technique of electrically isolating a semiconductor element formed on a semiconductor substrate.

To date, the LOCOS method (Local Oxidation Silicon Method) has been widely known as a technique for electrically isolating a semiconductor element. As seen from FIG. 1A, the LOCOS method comprises the steps of forming acid-resisting layer 3, for example, silicon nitride layer ($Si_3N_4$) on a semiconductor silicon substrate with silicon oxide layer 2 interposed therebetween, patterning the layer, selectively oxidizing the patterned layer with acid-resisting layer 3 used as a mask as shown in FIG. 1B, and providing thick insulation layer 4 for electrical isolation of a semiconductor element.

However, the above-mentioned LOCOS method has the drawback in that when, as shown in FIG. 1A, an opening is formed in acid-resisting layer 3 to expose silicon oxide layer 2, and semiconductor layer 1 is selectively oxidized with acid-resisting layer 3 used as a mask, then a difference appears, as shown in FIG. 1B, between length a of the opening of acid-resisting layer 3 of FIG. 1A and the length of broadened portion b of semiconductor element-isolating layer 4. Now let it be assumed that acid-resisting layer 3 has a thickness of 2500 Å; silicon oxide layer 2 interposed between semiconductor silicon substrate 1 and acid-resisting layer 3 has a thickness of 1500 Å; semiconductor-isolating insulation layer 4 used at the time of selective oxidation has a thickness of 5000 to 6000 Å. Then a difference between the aforementioned lengths a and b indicates 1.2 to 1.6 microns. When, therefore, it is attempted to provide a thoroughly electrically-insulating layer for electrical isolation of a semiconductor element, by using the LOCOS method, a limitation of about 2.0 microns is imposed on the effective width of the element-isolating insulation layer. Consequently, the LOCOS method has the drawback in that it is unsuited for isolation of a semiconductor element having a width narrower than the above-mentioned width limit.

Further, it has been experimentally confirmed that a definite relationship exists between the width and the thickness of an insulation layer used for the isolation of the semiconductor element; and that if the width of the element-isolating insulation layer is reduced, then its thickness also decreases; and that it is then impossible to realize a sufficient electrical isolation property for a semiconductor element. Now, assume that a semiconductor element-isolating insulation layer finished under the aforementioned conditions has a width of 1.4 microns. If, in this case, the occurrence of crystal defects in the semiconductor is taken into account, the resultant semiconductor element-isolating insulation layer will have a maximum thickness of about 3000 to 3200 Å. It is difficult to produce the insulation layer with a greater thickness than the above-mentioned level.

The thickness of insulation layer 4 for isolating semiconductor elements is defined by the relation between said thickness and the impurity concentration in the conductivity reversion-preventing layer underlying said insulation layer 4. The higher the impurity concentration, the greater the thickness of said insulation layer 4. However, of said conductivity reversion-preventing layer is allowed to contain an underly large amount of impurity, a decline will result in the resistance of a semiconductor element to electric conductivity and its operating speed, thereby determining to property of the semiconductor element.

As mentioned above, the conventional semiconductor apparatus manufacturing method which involves the formation of semiconductor element-isolating insulation layer 4 by the LOCOS process has the drawback in that the opened region of acid-resisting layer 3 and semiconductor element-isolating insulating layer 4 noticeably differ in length; and the semiconductor element-isolating insulation layer 4 fails to be formed with a sufficient thickness in the narrow prescribed semiconductor element-isolating region.

SUMMARY OF THE INVENTION

This invention has been devised in order to eliminate the aforementioned drawbacks accompanying the conventional semiconductor device-manufacturing method, and an object of this invention is to provide a semiconductor apparatus manufacturing method which is capable of forming, with high precision, a thick element-isolating insulation layer for the isolation of a semiconductor element even if it has a narrow width.

To attain the above-mentioned object, the semiconductor device manufacturing method according to the present invention comprises the steps of:

forming an oxide layer (a silicon oxide layer) on the surface of the semiconductor substrate for protection; forming an acid-resisting layer on the surface-protecting layer; selectively eliminating the acid-resisting layer by photoetching; forming an insulation layer by oxidizing the semiconductor substrate, with the retained acid-resisting layer being used as a mask; forming a polycrystalline silicon layer on the oxidized layer and retained acid-resisting layer; oxidizing the polycrystalline silicon layer; eliminating the insulation layer until the retained acid-resisting layer is exposed; and removing all the retained acid-resisting layer.

The above-mentioned semiconductor device manufacturing method embodying the present invention offers the advantages in that an oxidized layer is obtained by oxidizing a polycrystalline silicon layer on a thick oxidized layer prepared with an acid-resisting layer used as a mask, thereby providing a thick insulation layer for the isolation of a semiconductor element.

BRIEF DESCRIPTION OF THE DRAWINGS

FIGS. 2A to 2F show the sequential steps involved in the method of manufacturing a semiconductor apparatus according to a first embodiment of the present invention:

Figure 1A:
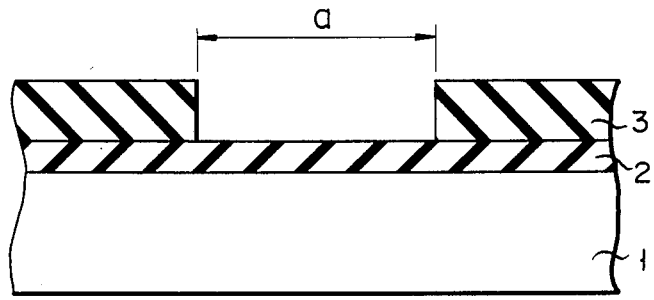
FIG. 1A shows the conventional semiconductor apparatus-manufacturing method, which comprises the steps of forming an acid-resisting layer on a semiconductor substrate with an oxide layer such as a silicon oxide layer interposed therebetween in order to provide a semiconductor element-isolating insulation layer and providing an opening in that portion when a semiconductor element-isolating insulating layer is to be provided.
Figure 1B:
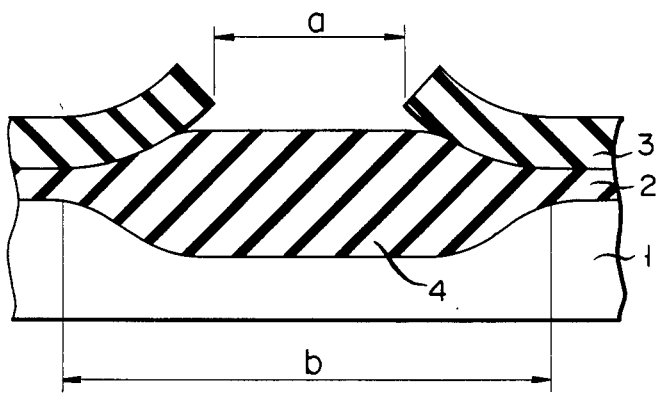
FIG. 1B indicates a difference between the length of and opening provided in the acid-resisting layer formed when a semiconductor element-isolating insulation layer is deposited by the conventional manufacturing process and the length of the crosswise broadened semiconductor element-isolating insulation layer.

To describe in detail, FIG. 2A indicates the process of oxidizing a silicon semiconductor substrate to provide a silicon oxide layer and depositing a silicon nitride layer acting as an acid-resisting layer on the silicon oxide layer;

FIG. 2B illustrates the process of first selectively removing said acid-resisting layer deposited on that region where the semiconductor element-isolating layer is to be formed and ion-implanting boron in the semiconductor substrate to provide a conductivity reversion-preventing layer;

FIG. 2C shows the process of oxidizing the semiconductor substrate to provide a semiconductor element isolating layer;

FIG. 2D sets forth the process of oxidizing the polycrystalline silicon layer to provide an insulation layer;

FIG. 2E illustrates the process of oxidizing the polycrystalline layer to form an insulation layer;

FIG. 2F indicates the process of removing the insulation layer until the acid-resisting layer is exposed and later eliminating the acid-resisting layer;

FIGS. 3A to 3C show the sequential steps of manufacturing a semiconductor apparatus according to a second embodiment of the present invention, noting that the preceding processes of FIGS. 3A to 3C are exactly the sames as those of FIGS. 2A to 2D.

To describe in detail, FIG. 3A represents the process of applying an anisotropic etching process to the polycrystalline silicon layer until the acid-resisting layer is exposed;

FIG. 3B indicates the process of oxidizing the polycrystalline silicon layer to form an insulation layer; and FIG. 3C illustrates the process of eliminating the acid-resisting layer.

DETAILED DESCRIPTION OF THE PREFERRED EMBODIMENT

Description will now be made, with reference to the accompanying drawings, of a semiconductor device embodying the present invention. First, as is shown in FIG. 2A, a P-type silicon substrate 11 of Miller indices (100) having a specific resistivity of 1 to 2 $\Omega.m$ is oxidized in a atmosphere of oxygen held at a temperature of 1000° C., thereby forming silicon oxide layer 12 with a thickness of 500 Å. Acid-resisting layer 13 is deposited, with a thickness of 1500 Å, by vapor phase growth on silicon oxide layer 12.

Next, acid-resisting layer 13 deposited on the region where a semiconductor element-isolating insulation layer is to be formed is selectively removed, for example, by the photoetching process. Later, boron is ion implanted in silicon substrate 11 to prevent to reversion of conductivity under the conditions:
acceleration voltage: 100 keV
dose rate: $5 \times 10^{13}$ $cm^{-2}$ As a result, conductivity reversion-preventing layer 11A is formed (FIG. 2A).

Thereafter, silicon substrate 11 is oxidized in an atmosphere composed of hydrogen and oxygen mixed in the ratio of about 1:5 and held at a temperature of 1000° C., thereby forming semiconductor element-isolating layer 14 (shown in FIG. 2C) with a thickness of about 6000 Å. Later, polycrystalline silicon layer 15 is deposited, by vapor phase growth, on acid-resisting layer 13 and semiconductor element-isolating layer 14 (FIG. 2D). At this time, polycrystalline silicon layer 15 is deposited on acid-resisting layer 13, at a thickness of about 2000 Å.

Since, however, a polycrystalline silicon layer is also grown from side walls 13a, 13b of the opening of acid-resisting layer 13, eventually, a semiconductor element-isolating oxidized layer may have a thickness as great as 3000 to 4000 Å.

Later, polycrystalline silicon layer 15 is all oxidized in an atmosphere consisting of hydrogen and oxygen mixed in the ratio of about 1:5 and held at a temperature of 1000° C., thereby providing insulation layer 15A (indicated in FIG. 2E). When polycrystalline silicon layer 15 is oxidized, acid-resisting layer 13 obstructs the introduction of oxygen from polycrystalline layer 15 to insulation layer 14, thereby suppressing the generation of bird's beak and further preventing the bird's beak from extending outward along the underside of the silicon nitride or the semiconductor element-isolating region. Then, silicon substrate 11 is immersed in a solution of ammonium fluoride, to remove oxidized layer 15A, thereby to expose the surface of acid-resisting layer 13. At this time, that portion of polycrystalline silicon layer 15 which is deposited on semiconductor element-isolating layer 14 has a greater thickness than acid-resisting layer 13. Therefore, portion of oxide layer 15A is retained on semiconductor-isolating oxide layer 14. Acid-resisting layer 13 is chemically etched to provide a thick semiconductor element isolating insulation layer 14a shown in FIG. 2F.

The known semiconductor apparatus-manufacturing process is applied to the respective activated regions isolated by semiconductor element-isolating insulation layer 14a, thereby forming elements such as MOS transistor or bipolar transistor.

The above-mentioned manufacturing method can reduce the minimum width of semiconductor element-isolating layer 14 to 0.8 micron. Therefore, the insulation layer can have a thickness of about 4000 Å. Moreover, the oxidation process based on the ordinary LOCOS process can be finished in a shorter time than before. Therefore, bird's beak is little likely to take place on those portions of insulation layer which lie near the opening side walls 13a, 13b of acid-resisting layer 13. Therefore, it is possible to reduce a difference between the length of the opening provided in the acid-resisting layer 13 and that of the semiconductor element-isolating region formed by semiconductor element-isolating insulation layer 14. Further, when polycrystalline silicon layer 15 is formed, thick polycrystalline silicon layer 15 is deposited on the opening side walls 13a, 13b of acid-resisting layer 13. Therefore, uniform semiconductor element-isolating layer 14a can be formed regardless of the width of the semiconductor element-isolating region, though generally the thickness of polycrystalline layer 15 and that of semiconductor element-isolating region change relatively.

Since the oxidizing process can be finished in a short time, the present invention offers the following advantages. Silicon substrate 11 is oxidized only slightly, and consequently its volumetric expansion is small. Silicon substrate 11 undergoes slight mechanical stress, thereby reducing the possibility of producing crystal defects in silicon substrate 11.

The foregoing example refers to the case wherein deposited polycrystalline silicon layer 15 was oxidized, and later, oxide layer 15A was etched. However, it is possible to subject deposited polycrystalline silicon layer 15 to anisotropic etching until silicon nitride layer is exposed, and perform oxidation with polycrystalline layer 15 retained on semiconductor element-isolating insulation layer 14.

As shown in from FIG. 3A to FIG. 3C, the foregoing embodiment of the present invention refers to the case where oxidized polycrystalline silicon layer (15) was deposited to provide semiconductor element-isolating layer (14). Obviously, it is possible to replace polycrystalline silicon layer (15) by amorphous silicon layer or single crystal silicon layer.

The aforesaid example refers to the case wherein a semiconductor element-isolating oxide layer is deposited on a P-type silicon substrate. Obviously, the present invention is also applicable to an N-type silicon substrate and to the CMOS process.

What is claimed is:

1. A method of manufacturing a semiconductor device, which comprises the steps of:
    depositing a surface-protecting layer on a semiconductor substrate;
    forming an acid-resisting layer on said surface-protecting layer;
    selectively eliminating said acid-resisting layer;
    oxidizing said semiconductor substrate, with the retained acid-resisting layer being used as a mask, thereby to provide an oxidized layer;
    depositing a silicon layer on said oxidized layer and said retained acid-resisting layer;
    oxidizing the silicon layer to provide an insulation layer;
    eliminating said oxidized silicon layer until said retained acid-resisting layer is exposed; and
    eliminating all the retained acid-resisting layer.

2. The method according to claim 1, wherein said surface-protecting layer is prepared from a silicon oxide layer.

3. The method according to claim 1, wherein said surface-protecting layer is deposited by the vapor phase growth method.

4. The method according to claim 1, wherein said acid-resisting layer is prepared from a silicon nitride layer.

5. The method according to claim 1, wherein said semiconductor substrate consists of a silicon substrate.

6. The method according to claim 1, wherein said semiconductor substrate is oxidized in an atmosphere of $H_2+O_2$ held at a temperature of 1000° C.

7. The method according to claim 1, wherein said polycrystalline silicon layer is formed by the vapor phase growth method.

8. The method according to claim 1, wherein said polycrystalline silicon layer is prepared by oxidation in an atmosphere of $H_2+O_2$ held at a temperature of 1000° C.

9. The method according to claim 1, wherein said oxidized polycrystalline silicon layer is removed by immersion in a solution of ammonium fluoride.

10. The method according to claim 1, wherein said acid-resisting layer is eliminated by use of the chemical dry etching process.

11. A method of manufacturing a semiconductor apparatus which comprises the steps of:
    forming a surface-protecting layer on a semiconductor substrate;
    depositing an acid-resisting layer on said surface-protecting layer;
    selectively eliminating said acid-resisting layer;
    oxidizing said semiconductor substrate by oxidation, with the retained acid-resisting layer used as a mask, thereby providing an oxidized layer;
    depositing a silicon layer on said oxidized layer and said retained acid-resisting layer;
    eliminating said silicon layer until said retained acid-resisting layer is exposed;
    oxidizing the silicon layer retained on said oxidized layer to provide an insulation layer; and
    removing all the retained acid-resisting layer.

12. The method according to claim 11, wherein said surface-protecting layer consists of a silicon oxide layer.

13. The method according to claim 11, wherein said surface-protecting layer is deposited by the vapor phase growth method.

14. The method according to claim 11, wherein said acid-resisting layer consists of a silicon nitride layer.

15. The method according to claim 11, wherein said semiconductor substrate consists of a silicon substrate.

16. The method according to claim 11, wherein said semiconductor substrate is oxidized in an atmosphere of $H_2+O_2$ held at a temperature of 1000° C.

17. The method according to claim 11, wherein said polycrystalline silicon layer is oxidized in an atmosphere of $H_2+O_2$ held at a temperature of 1000° C.

18. The method according to claim 11, wherein said oxidized polycrystalline silicon layer is eliminated by immersion in a solution of ammonium fluoride.

19. The method according to claim 11, wherein said acid-resisting layer is eliminated by use of the chemical dry etching process.

* * * * *